United States Patent [19]

Burke et al.

[11] Patent Number: 4,482,913
[45] Date of Patent: Nov. 13, 1984

[54] SEMICONDUCTOR DEVICE SOLDERED TO A GRAPHITE SUBSTRATE

[75] Inventors: Michael A. Burke; Clarence A. Andersson, both of Pittsburgh, Pa.

[73] Assignee: Westinghouse Electric Corp., Pittsburgh, Pa.

[21] Appl. No.: 351,809

[22] Filed: Feb. 24, 1982

[51] Int. Cl.³ .................. H01L 21/58; H01L 23/14; H01L 23/32
[52] U.S. Cl. ........................ 357/67; 357/65; 357/71
[58] Field of Search .................... 357/71, 67

[56] References Cited

U.S. PATENT DOCUMENTS

| | | | |
|---|---|---|---|
| 3,633,076 | 1/1972 | Nurnberg | 357/71 |
| 4,074,305 | 2/1978 | Johnston, Jr. et al. | 357/65 X |
| 4,077,818 | 3/1978 | Chu | 357/59 X |
| 4,101,925 | 7/1978 | Kelley et al. | 357/68 |
| 4,213,801 | 7/1980 | Johnston, Jr. | 357/71 X |
| 4,372,809 | 2/1983 | Grewal et al. | 357/71 X |

Primary Examiner—Andrew J. James
Assistant Examiner—S. V. Clark
Attorney, Agent, or Firm—C. L. Menzemer

[57] ABSTRACT

The present invention is directed to a semiconductor device in which a wafer of semiconductor material is soldered to a graphite substrate.

4 Claims, 1 Drawing Figure

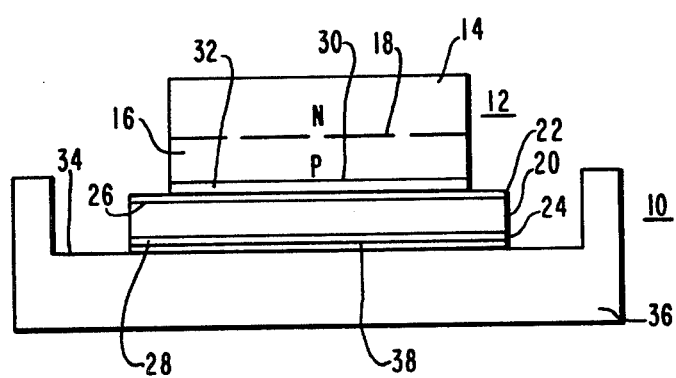

SEMICONDUCTOR DEVICE SOLDERED TO A GRAPHITE SUBSTRATE

BACKGROUND OF THE INVENTION

1. Field of the Invention

The present invention is in the field of power semiconductor devices.

2. Description of the Prior Art

Power semiconductors have been made with substrates of an iron-nickel alloy sold under the Trademark Kovar, and with molybdenum, tungsten and tantalum substrates. Devices having molybdenum substrates are the most common.

SUMMARY OF THE PRESENT INVENTION

The present invention is directed to a power semiconductor device comprising a wafer of silicon, said wafer containing at least one p-type region and at least one n-type region with a p-n junction between said p and said n-type region, said wafer having major opposed surfaces, and a graphite substrate soldered to one of said major surfaces.

BRIEF DESCRIPTION OF THE DRAWING

For a better understanding of the present invention, reference should be had to the following detailed discussion and drawing, the sole FIGURE of which is a side view of a portion of a power diode.

DESCRIPTION OF THE PREFERRED EMBODIMENT

With reference to the FIGURE, there is shown a portion of a power diode 10. The power diode 10 is comprised of a wafer or body 12 of silicon. The wafer or body 12 of silicon contains an n-type region 14, a p-type region 16 with a p-n junction 18 between the n-type region 14 and the p-type region 16.

The power diode 10 is also comprised of a substrate 20 of graphite.

The graphite substrate 20 has a layer 22 and a layer 24 of a metal selected from the group consisting of aluminum and molybdenum formed on surfaces 26 and 28 respectively of the substrate 20 to facilitate soldering.

The layers 22 and 24 may be formed by any satisfactory process known to those skilled in the art as for example sputtering.

The thickness of the layers 22 and 24 need only be thick enough to facilitate soldering and not so thick as to constitute an ohmic resistance. A thickness of 10,000 Angstrom units has been found satisfactory.

The graphite substrate 20 is soldered to surface 30 of wafer 12 by a solder layer 32 disposed between the wafer 12 and metal layer 22.

The graphite substrate 20 is also soldered to surface 34 of base member 36 by a solder layer 38 disposed between metal layer 28 and surface 34 or base member 36.

The solder layers 32 and 38 may be any suitable solder known to those skilled in the art.

The base member 36 may be a nickel coated copper member and together with a cap member (not shown) forms a case member for hermetically enclosing the power diode.

The graphite substrate 20 is a molded member. Particularly satisfactory results have been realized using graphite sold commercially under the Trade Name ATJ by Union Carbide. ATJ carbide is reactor grade carbide, formed into compacts by cold pressing and has a grain size of 5 mils.

The size of the substrate will vary according to the size of the silicon wafer. For a wafer of 2 inch diameter a substrate having a diameter of 2 inches and a thickness of from 60 to 36 mils thick has been found satisfactory.

A substrate provides electrical and thermal contact between the wafer and the case member. The substrate also protects the wafer during fabrication and protects the wafer from stresses during packaging.

The electrical conductivity of graphite is high approximately 40 ohm-cm thus electrical losses in the graphite substrate are small.

The coefficient of thermal expansion of graphite is $2.45 \times 10^6$ per °C. compared to silicons $3 \times 10^6$ per °C. Graphite also has a low elastic modulus, $1.3 \times 10^6$ psi compared to silicons $10^6$ psi.

The stresses developed on a silicon wafer due to differences in thermal expansion between silicon and graphite are much less than those developed in a silicon wafer by the commonly used molybdenum substrate.

The present invention has been explained relative to a diode, i.e., a wafer with two regions of opposite type conductivity and one p-n junction, it should be understood however, that the teachings of this invention are equally applicable to transistors and four and five region solid state switches.

We claim as our invention:

1. A power semiconductor device comprising a wafer of silicon, said wafer containing at least one p-type conductivity region and at least one n-type conductivity region with a p-n junction between adjacent regions of different conductivity type, said wafer having opposed surfaces, and a graphite substrate, said graphite substrate being soldered to one of said opposed surfaces of said wafer.

2. The device of claim 1 in which the surface of the substrate soldered to the wafer has a layer of a metal disposed thereon said metal being selected from the group consisting of aluminum and molybdenum.

3. The device of claim 1 in which the graphite substrate is also soldered to a base member.

4. The device of claim 3 in which the surface of the substrate soldered to the wafer and the surface of the substrate soldered to the base member have a layer of a metal disposed thereon, said metal being selected from the group consisting of aluminum and molybdenum.

* * * * *